(12) United States Patent
Doblar

(10) Patent No.: US 6,359,945 B1
(45) Date of Patent: Mar. 19, 2002

(54) PHASE LOCKED LOOP AND METHOD THAT PROVIDE FAIL-OVER REDUNDANT CLOCKING

(75) Inventor: Drew G. Doblar, San Jose, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/236,865

(22) Filed: Jan. 25, 1999

(51) Int. Cl.$^7$ .................................................. H04L 7/00
(52) U.S. Cl. ........................ 375/357; 375/376; 327/147; 327/156
(58) Field of Search .................................. 375/357, 373, 375/374, 376; 327/148, 150, 156, 157, 159, 163, 147

(56) References Cited

U.S. PATENT DOCUMENTS

| | | | |
|---|---|---|---|
| 4,025,874 A | | 5/1977 | Abbey |
| 4,282,493 A | | 8/1981 | Moreau |
| 4,972,442 A | * | 11/1990 | Steierman |
| 5,638,410 A | * | 6/1997 | Kuddes |
| 5,648,964 A | | 7/1997 | Inagaki et al. |
| 5,699,387 A | * | 12/1997 | Seto et al. |
| 5,969,558 A | | 10/1999 | Abe |

OTHER PUBLICATIONS

"Dynamic Switch PLL Clock Driver," Motorola Semiconductor Technical Data, 1997, pp. 1–6.

\* cited by examiner

*Primary Examiner*—Amanda T. Le
(74) *Attorney, Agent, or Firm*—Conley, Rose & Tayon, PC; B. Noël Kivlin

(57) ABSTRACT

A system and method for switching between input clock signals from different clock sources without losing lock by providing a supplemental correction signal to the loop filter in a phase locked loop (PLL) circuit. The phase detector includes a supplemental correction pulse generator configured to offset, at least partially, the effects of losing an input clock signal from a first clock source failure. The phase detector is coupled to receive the input clock signal and a feedback signal. The phase detector outputs a phase error signal indicative of a comparison between the input clock signal and the feedback signal. The loop filter is coupled to receive the phase error signal and to output an error correction signal. A voltage controlled oscillator is coupled to receive the error correction signal and to generate the output signal of the PLL, with the feedback signal indicative of the output signal. Switching logic is coupled to monitor the input clock signal from the first clock source for a failure. In response to detecting the failure of the first clock source, the switching logic is configured to cause the input clock signal from a second clock source to be provided to the phase detector. This configuration may advantageously maintain lock in the PLL circuit while switching between clock sources for the input clock signal. The phase detector may further include a pulse width limiting circuit. The pulse width limiting circuit is configured to shorten each phase error output signal by a predetermined amount.

31 Claims, 8 Drawing Sheets

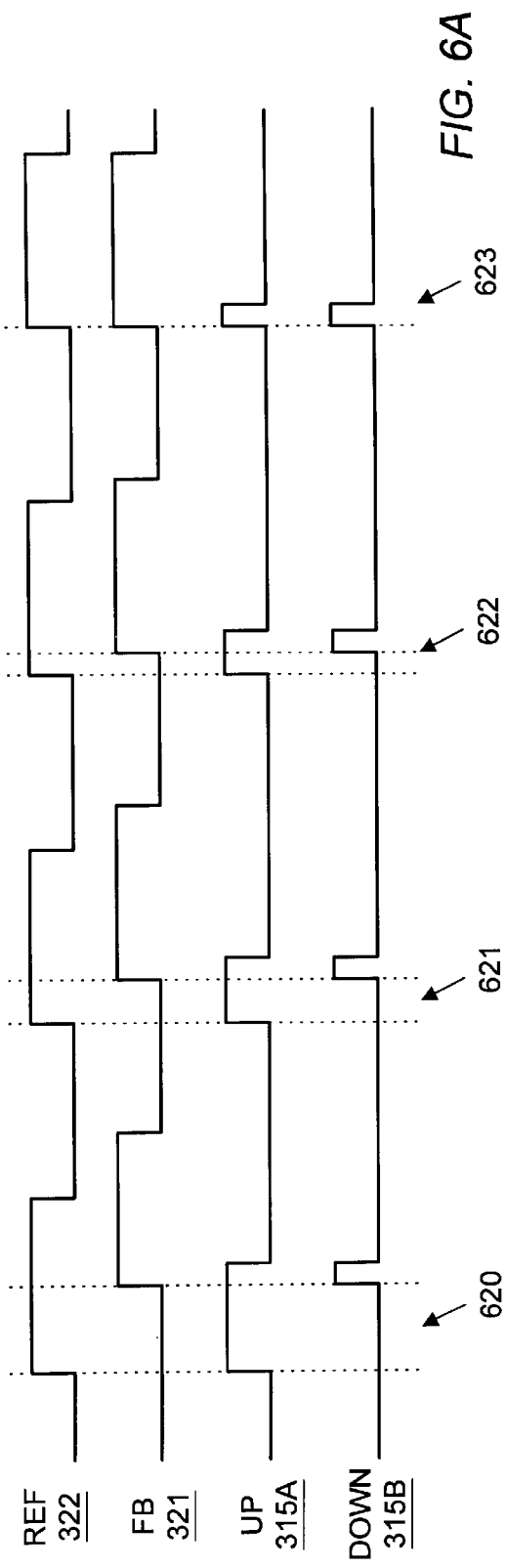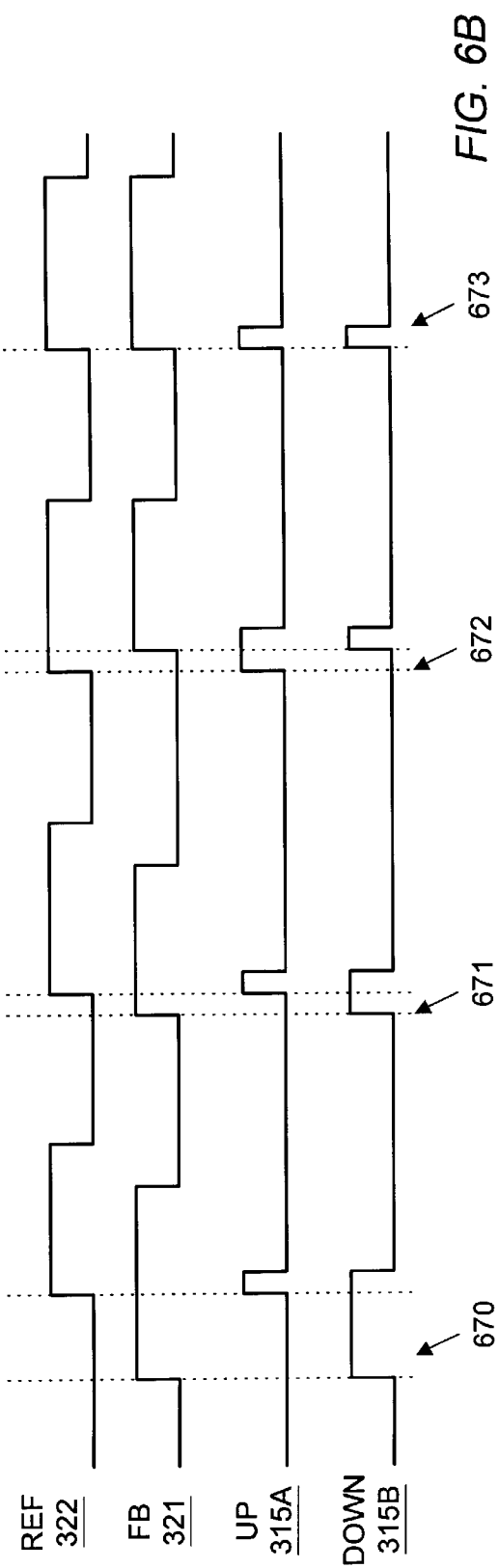

PHASE LOCKED LOOP AND METHOD THAT PROVIDE FAIL-OVER REDUNDANT CLOCKING

FIELD OF THE INVENTION

This invention relates to phase-locked loop (PLL) circuits, and, more particularly, to a PLL that is configured to fail-over from one input clock signal to another input clock signal without losing lock.

DESCRIPTION OF THE RELATED ART

The need to generate a local signal which is synchronized with an external reference signal is critical in many electronics applications such as frequency synthesis, clock recovery, clock generation and frequency demodulation. This coherence between the reference signal and the local replica is referred to as "phase synchronization". This implies either that local signal is typically either in phase with the external reference signal or is offset from the reference signal by some phase constant.

At the heart of any such synchronization circuit is some form of a phase locked loop (PLL). Phase-locked loops are feedback control loops, whose controlled parameter is the phase of a locally generated replica of an incoming reference signal. Phase-locked loops have three basic components: a phase detector, a loop filter, and a voltage-controlled oscillator.

FIG. 1—Basic PLL

A basic schematic diagram of a typical PLL 100 is presented in FIG. 1. As shown, PLL 100 is configured to generate an output signal 120 in response to an input signal 112. PLL 100 includes a phase detector 114, a loop filter 116, and a voltage-controlled oscillator (VCO) 118. Phase detector 114 is coupled to receive input clock signal 112 and to produce output clock signal 120. Phase detector 114 measures the phase difference between signals 112 and 120, and generates a phase error signal 115, which may be a voltage indicative of this phase difference. In some instances, phase detector 114 may also generate a signal even when there is no difference between signals 112 and 120. As signals 112 and 120 change with respect to each other, signal 115 becomes a time-varying signal into loop filter 116. This phase comparison is necessary to prevent output signal 120 from drifting with respect to reference signal 112. As shown, the feedback signal 121 is an internal part of the PLL 100. It is noted, as is shown below, that the feedback signal 121 may be a signal external to the PLL 100.

Loop filter 116 governs the response of PLL 100 to the error detected between signals 112 and 120. A well-designed loop filter 116 should be able to track changes in the incoming signal's phase but should not be overly responsive to signal noise. Loop filter 116 generates an error correction signal 117, which is the input to VCO 118. In one embodiment, a zero voltage on signal 117 causes the output of VCO 118, output signal 120, to oscillate at a predefined frequency, $\omega_0$, which is the "center" frequency of the oscillator. On the other hand, a positive voltage on error correction signal 117 causes output signal 120 to oscillate at a frequency which is greater than $\omega_0$. Conversely, a negative voltage on error correction signal 117 causes output signal 120 to oscillate at a frequency less than $\omega_0$. In another embodiment, described below, either a positive voltage or a negative voltage on error correction signal 117 is generated. In this embodiment, even when there is no difference between signals 112 and 120, an error correction signal 117 is output. In still another embodiment, the error correction signal 117 is scaled such that although the error correction signal 117 is always of one sign, such as always positive, the error correction signal 117 corrects for oscillation either above or below the predefined frequency.

Generally speaking, in many embodiments, the output frequency of VCO 118 is a linear function of its input voltage over some range of input and output. "Phase lock" is achieved by feeding the output of VCO 118 back to phase detector 114 so that continual error correction may be performed. It is noted that PLL 100 may not achieve phase lock if reference signal 112 is outside of some predetermined range.

In its simplest form, loop filter 116 is simply a conductor; that is, phase error signal 115 is equal to error correction signal 117. Such a filter 116 allows PLL 100 to generate an output signal 120 which matches reference signal 112 in frequency and phase only if reference signal 112 is equal to the center frequency of VCO 118. If reference signal 112 oscillates at a different frequency from the center frequency of VCO 118, output signal 120 may match reference signal 112 in frequency but not phase. This "wire filter" is an example of a first-order PLL, which means that the denominator of the loop filter transfer function has no exponent value greater than one. In another embodiment of a first-order PLL, loop filter 116 includes an amplifier.

FIG. 2—PLL with Multiple Clock Inputs

Second-order PLLs, such as shown in FIG. 2, are more commonly used than first-order PLLs 100. The second-order PLL 200, as shown, also incorporates a mechanism for switching input clock signals between a first clock source 222A and a second clock source 222B. It is noted that the first clock source 222A and the second clock source 222B are preferably synchronized in frequency and in phase. The selection of the input clock signal from the first clock source 222A or the second clock source 222B may be made by a SEL_CLK input or by the switching logic 230. Switching logic 230 receives CONTROL inputs and outputs STATUS information. The input clock signal is provided to a phase detector 214. The phase detector outputs a phase error signal 215 as a combination of UP and/or DOWN pulses. These UP and DOWN pulses are typically digital signals indicative of the phase difference between the input clock signal and the feedback signal 221. The UP pulse is indicative of a phase difference between the feedback signal 221 and the input clock signal when an edge of the feedback signal 221 occurs after a corresponding edge of the input clock signal. The DOWN pulse is indicative of a phase difference between the feedback signal 221 and the input clock signal when an edge of the feedback signal 221 occurs before a corresponding edge of the input clock signal.

One difference between the first-order PLL 100 and the second-order PLL 200 is that the second-order PLL has an integrating loop filter 216. A second order loop filter 216 performs an integration function, such as that typically found in a low-pass filter. This functionality allows the second-order PLL 200 to generate an output signal 220 which matches reference signal 212 in phase and frequency when reference signal 222 is not identical to the center frequency of VCO 218. This is possible since the second-order loop filter is configured to generate a non-zero error correction signal even when signals 222 and 220 match in phase. This non-zero error correction signal allows VCO 218 to oscillate at above or below its center frequency while remaining in phase with reference input clock signal 222.

It is noted that third-order (and possibly higher-order) PLLs exist and are commonly used in circuits such as those used in cellular and satellite communications. Third-order PLLs include third-order loop filters configured to perform double integration, which allows frequency and phase synchronization to occur even with a Doppler shift between the reference clock signal and output signal. It is also noted that multipliers and/or dividers are also used to generate an output signal, which is different, such as in frequency or phase, than the reference input signal.

An important feature of the PLL 200 of FIG. 2 is the ability to switch between an input clock signal 222A from a first clock source and the input clock signal 222B from a second clock source. The switching logic 230 is configured to detect a failure of the input clock signal 222A from the first clock source and to cause the input clock signal 222B from the second clock source to be provided to phase detector 214 in the place of the input clock signal 222A.

Although the switching logic 230 responds fairly quickly to the failure of the clock source, by the time the new clock source is switched in, the effects of the "bad" clock (or loss of clock) has propagated through the PLL 200 and has modified the feedback signal 221 such that the PLL 200 can no longer maintain the phase synchronization between the input clock signal and the feedback signal (i.e. the PLL 200 loses phase lock). What is needed is a PLL system and method of operation thereof that switches between the input clock signals from a first clock source and a second clock source without losing lock.

SUMMARY OF THE INVENTION

The problems outlined above are in large part solved by a phase locked loop (PLL) and controller that provide fail-over redundant clocking. The PLL switches between input clock signals from different clock sources without losing lock by providing a supplemental correction signal to the loop filter in a PLL circuit. In one embodiment, the phase detector includes a supplemental correction pulse generator configured to offset, at least partially, the effects of losing the input clock signal from a first clock source failure. The phase detector is coupled to receive an input clock signal from a first clock source and a feedback signal. The phase detector outputs a phase error signal indicative of a comparison between the input clock signal and the feedback signal. The loop filter is coupled to receive the phase error signal and to output an error correction signal. A voltage controlled oscillator is coupled to receive the error correction signal and to generate the output signal of the PLL. The feedback signal is indicative of the output signal of the PLL. Switching logic is coupled to monitor the input clock signal from the first clock source for a failure. In response to detecting the failure of the first clock source, the switching logic is configured to cause the input clock signal from a second clock source to be provided to the phase detector. Also in response to detecting the failure of the first clock source, the supplemental error correction signal is injected. This configuration may advantageously maintain lock in the PLL circuit while switching between clock sources for the input clock signal.

In a further embodiment, the phase detector further includes a pulse width limiting circuit. The pulse width limiting circuit is configured to shorten each phase error output signal by a predetermined amount. In one embodiment, the phase error signals are digital signals comprising an UP signal and a DOWN signal. The pulse widths of the UP and the DOWN signal are each shortened by the pulse width limiting circuit. In one embodiment, failure of the clock source is defined as an absence of three or more clock edges of the input clock signal. In another embodiment, the failure results in a maximum length DOWN pulse. In still another embodiment, the supplemental correction signal comprises a maximum length UP pulse. The shortened phase error output signal may advantageously result in slower PLL output drift upon the failure of the input clock signal.

A method is likewise contemplated for operating a PLL circuit. The method comprises, in one embodiment, detecting a phase difference between an input clock signal from a first clock source and a feedback signal. The method further outputs a phase error signal indicative of the phase difference. The phase error signal is converted into an error correction signal. The method produces oscillations in response to the error correction signal, with the feedback signal indicative of the oscillations. The method further monitors the input clock signal from the first clock source for a failure. In response to the failure, the method provides the input clock signal from a second clock source in place of the input clock signal from the first clock source. The method further outputs a supplemental correction signal in response to the failure. The method may advantageously maintain lock in the PLL circuit while switching between clock sources for the input clock signal.

BRIEF DESCRIPTION OF THE DRAWINGS

Other objects and advantages of the invention will become apparent upon reading the following detailed description and upon reference to the accompanying drawings in which:

FIGS. 6A and 6B are timing diagrams illustrating basic operation of the PLL of FIG. 3.

Figure 1:
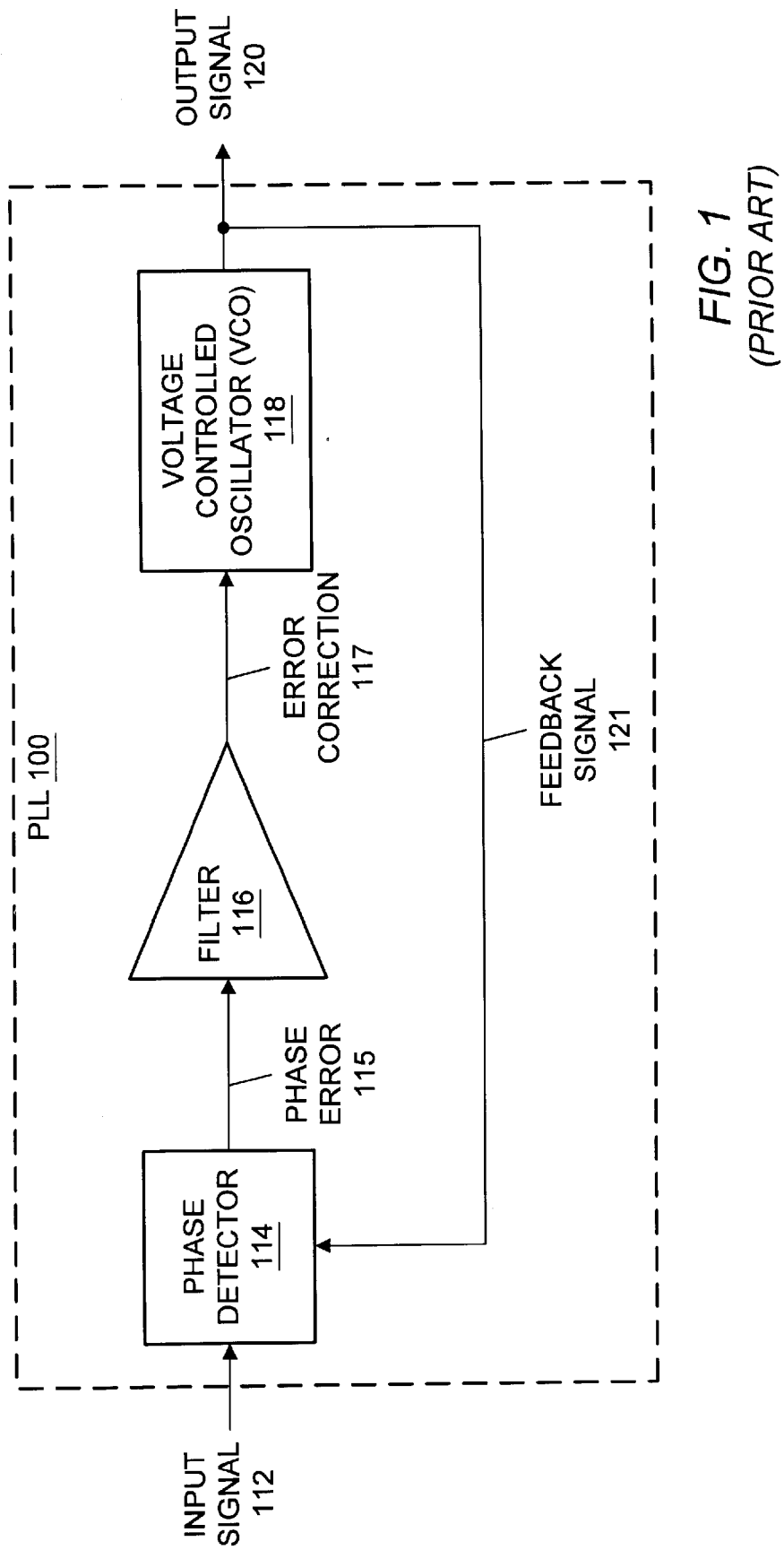
FIG. 1 is a block diagram of a generalized prior art phase locked loop (PLL)
Figure 2:
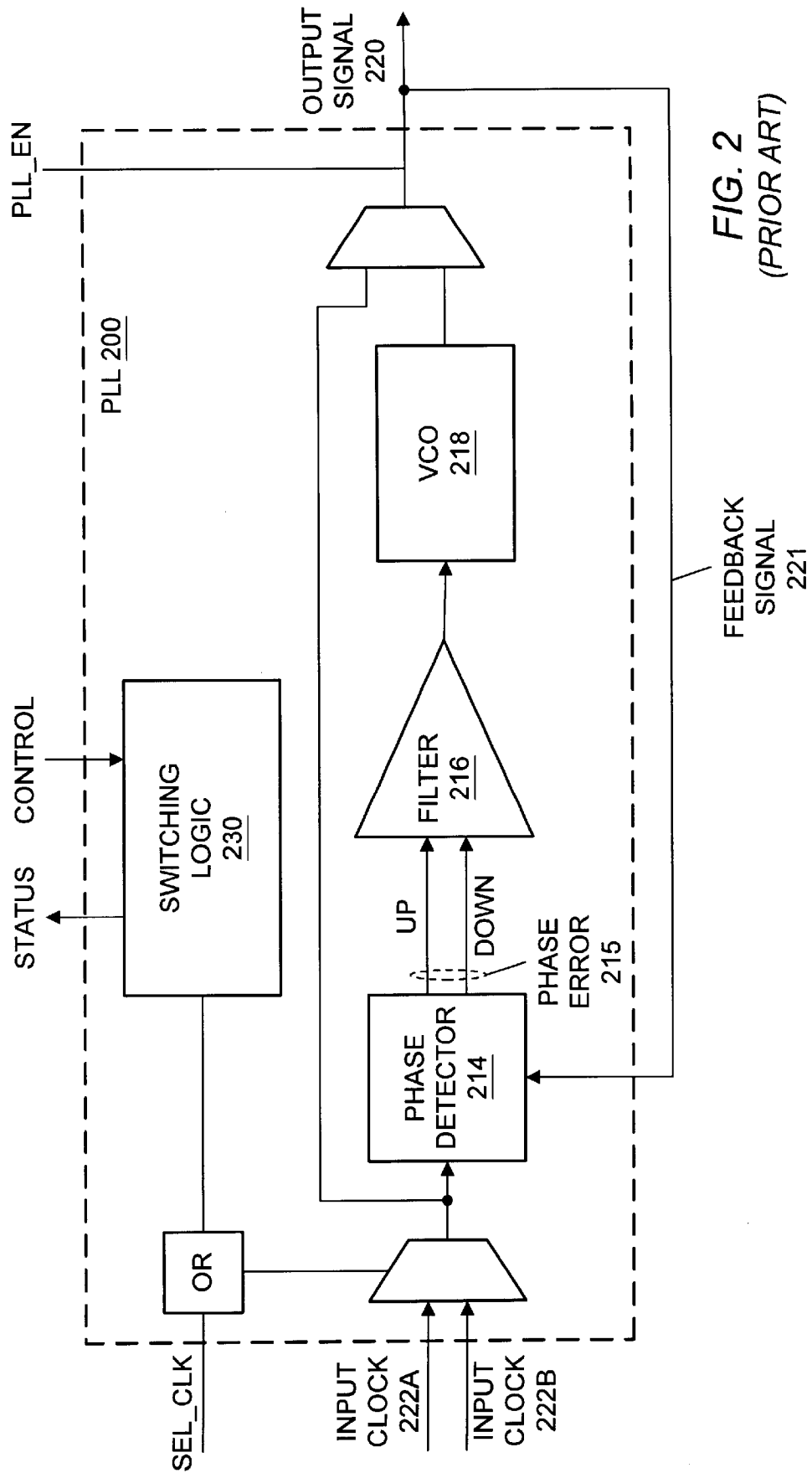
FIG. 2 is a block diagram of an embodiment of a prior art PLL including switching logic configured to switch between input clock signals.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
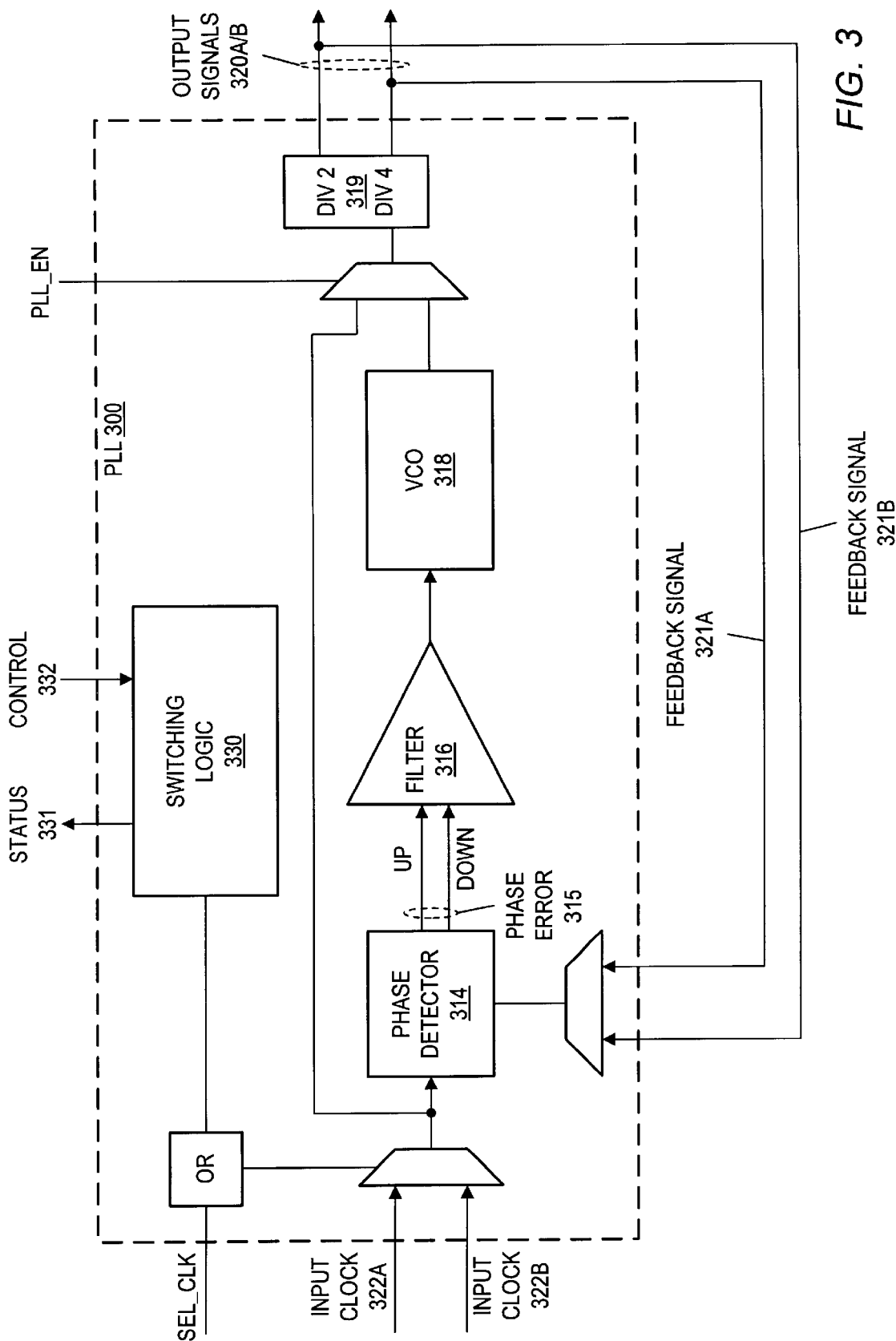
FIG. 3 is a block diagram of a PLL with switching logic as well as a supplemental correction pulse generator and a pulse limiting circuit.

FIG. 3—PLL with Switching Logic and Supplemental Error Correction

Turning to FIG. 3, a block diagram of a phase locked loop (PLL) circuit is illustrated. Preferably implemented as a monolithic integrated circuit, PLL 300 includes a first multiplexer coupled to receive a first input clock signal 322A from a first clock source and a second input clock signal 322B from a second clock source. The multiplexer is controlled by a signal from an OR block coupled to receive a select clock input SEL_CLK and the output of switching logic 330. The select clock input sets the identity of the primary clock input. Switching logic 330 receives CONTROL inputs 332 and outputs STATUS outputs 331.

The output of the input multiplexer is the input clock signal provided to the phase detector 314 and to an output multiplexer. The phase detector 314 receives the input clock signal 322 from the input multiplexer and a feedback signal 321 from a feedback multiplexer. The phase detector is configured to produce a phase error signal 315 indicative of the difference between the input clock signal and the feedback signal 321. As shown, the phase error signal 315 comprises an UP pulse and a DOWN pulse, each preferably being digital signals. The UP pulse is indicative of a phase difference between the feedback signal 321 and the input clock signal 322 when an edge of the feedback signal 321 occurs after a corresponding edge of the input clock signal 322. The DOWN pulse is indicative of a phase difference between the feedback signal 321 and the input clock signal 322 when an edge of the feedback signal 321 occurs before a corresponding edge of the input clock signal 322.

A loop filter 316 is coupled to receive the phase error signal and to output an error correction signal to a voltage controller oscillator (VCO) 318. In a preferred embodiment, the loop filter comprises an active low-pass filter configured as an integrator. The VCO 318 is coupled to receive the an error correction signal from the loop filter 316 and to produce oscillations indicative of the error correction signal. The oscillating signal is presented as a second input to the output multiplexer. A PLL enable signal PLL_EN is provided to either select the output of the VCO or the input clock signal 322 to output. In the illustrated embodiment, the output of the output multiplexer is divided in a divider circuit 319, either by 2 or 4 as shown, to produce one or more PLL output signals 320 A/B. The feedback signals 321A and 321B are shown coupled to the output signals of the PLL 320A/B.

Figure 4:
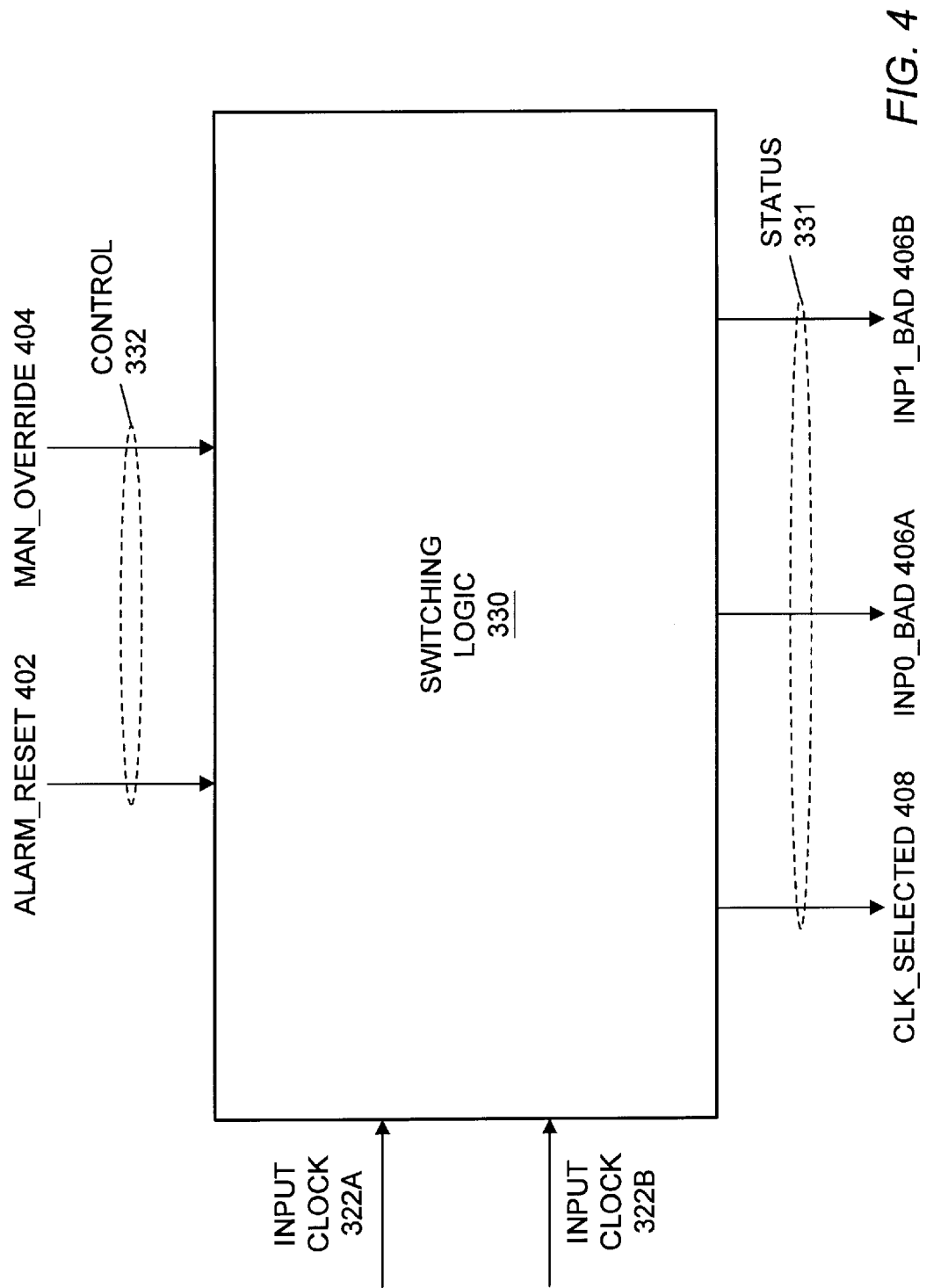
FIG. 4 is an embodiment of the switching logic of FIG. 3.

FIG. 4—Switching Logic

Turning now to FIG. 4, an embodiment of the switching logic 330 is illustrated. The input clock signals 322A and 322B are provided to the switching logic 330. Also provided are CONTROL signals 332, including an alarm reset ALARM_RESET 402 and a manual override MAN_OVERRIDE 404. The switching logic 330 outputs STATUS signals 331, including an indication of which input clock signal is selected CLK_SELECTED 408, and an indication if either input clock has failed, INP0_BAD 406A and INP1_BAD 406B. The PLL 300 will use the second input clock 322B upon the failure of the first input clock 322A until the alarm reset signal 402 is received. The manual override operates to disable the switching logic 330.

It is noted that in various embodiments, the switching logic 330 may also be configured to monitor the phase error signal 315 or other signals, as desired, in order to detect a failure of the input clock signal 322 or the feedback signal 321. Likewise, additional CONTROL signals 332 and STATUS signals 331 are also contemplated.

Figure 5A:
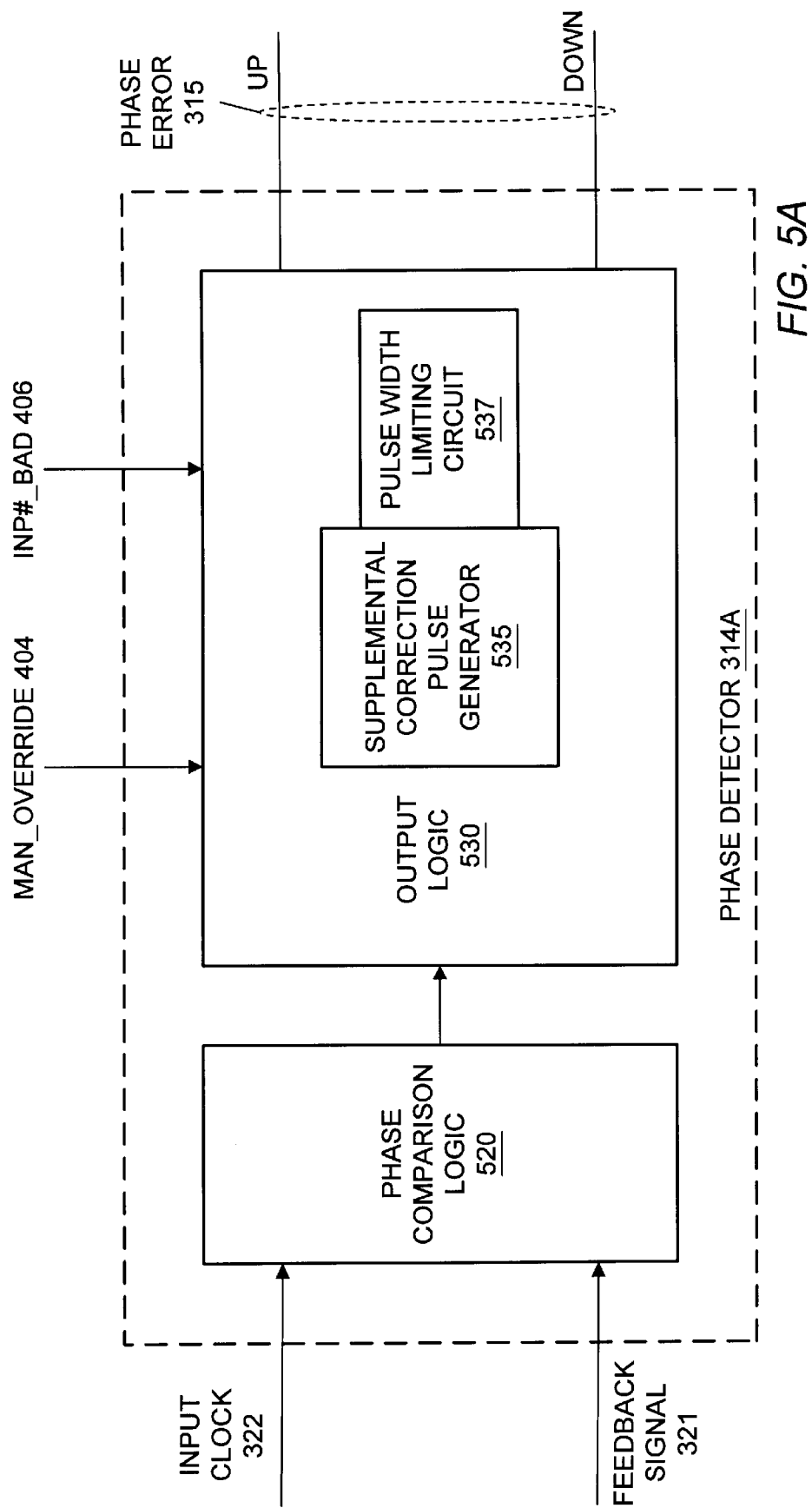
FIGS. 5A and 5B are block diagrams of embodiments of the phase detector of FIG. 3, which incorporate the supplemental correction pulse generator and the pulse limiting circuit.
Figure 5B:
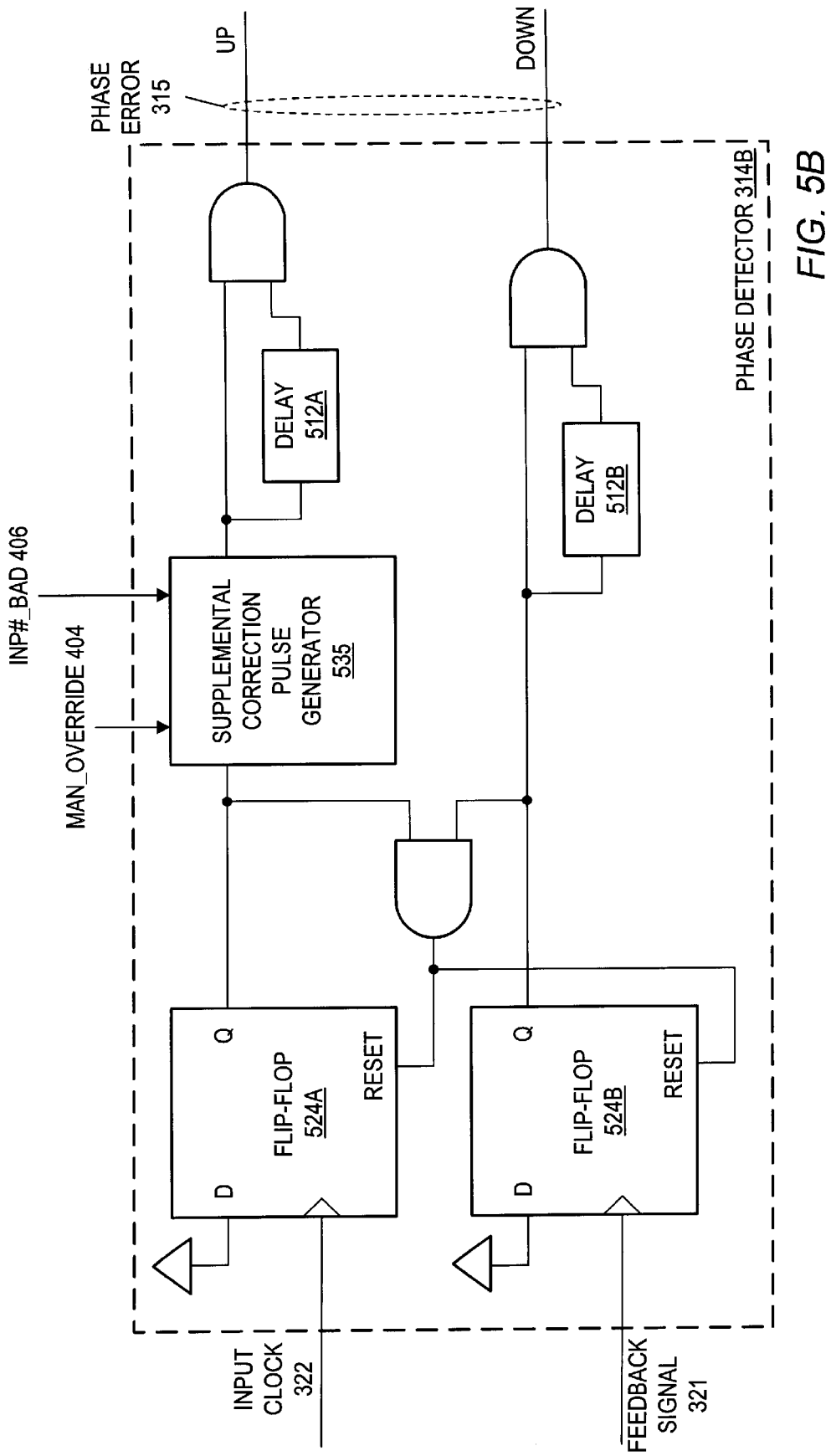

FIGS. 5A and 5B—Phase Detectors 314A and 314B

Turning now to FIGS. 5A and 5B, embodiments of the phase detector 314 are illustrated. In FIG. 5A, the input clock signal 322 and the feedback signal 321 are provided to phase comparison logic 520 of phase detector 314A. The phase comparison logic 520 provides a signal indicative of the phase difference between the input clock signal 322 and the feedback signal 321 to output logic 530. The output logic 530 further receives the manual override signal MAN_OVERRIDE 404 and the failure notification signal INP#_BAD 406. In a preferred embodiment, as shown, the output logic 530 includes a supplemental correction pulse generator 535 and a pulse width limiting circuit 537. The output logic 530 provides the phase error signal 315 to the loop filter 316. It is noted that in the embodiment illustrated in FIG. 5A, the phase error signal 315 comprises a digital UP signal and a digital DOWN signal.

In FIG. 5B, one specific embodiment of phase detector 314B is shown. It is noted that a variety of circuits and components may be substituted for those shown, as suggested in FIG. 5A. The input clock signal 322 and the feedback signal 321 are provided to the clock inputs of a pair of flip-flops 524A and 524B, respectively, which has the data input lines held HIGH. Upon the receipt of a respective clock edge, the flip-flops 524A and 524B each output a logical "1". The output is maintained at logical "1" until both output lines are high. The output lines of the flip-flops 524A and 524B are combined by a logical AND, with the result provided to the RESET inputs of both flip-flops 524A and 524B. Thus, the flip-flops 524A and 524B reset when both flip-flops 524A and 524B output a logical "1". The outputs of the flip-flops 524A and 524B are provided to logical ANDs on the output of the phase detector 314B, both directly and through delay elements 512A and 512B, respectively.

The supplemental correction pulse generator 535 coupled in series on the UP side of the phase detector 314B is configured to output a maximum UP pulse upon receiving notification of a failure of the input clock signal 322 from the present source. As shown, the supplemental correction pulse generator 535 also receives the manual override MAN_OVERRIDE signal 404 and the clock source failure notification signal(s) INP#_BAD 406. In one embodiment, the supplemental correction pulse generator 535 includes a resettable one-shot. Other circuits capable of providing a pulse are also contemplated.

The output of the phase detector 314B includes the phase error signal 315 comprising in this embodiment, a digital UP pulse and a digital DOWN pulse. The UP pulse results from the clock edge of the input clock signal 322 being provided to the phase detector 314B ahead of the corresponding clock edge of the feedback signal 321. Thus, flip-flop 524A outputs a logical "1" before flip-flop 524B outputs a logical "1". The length of the UP pulse is limited by the pulse limitation of the delay 512A. The minimum and maximum pulse width of the UP pulse may be predetermined by the length of time of the delay provided by delay element 512A and by the reset time of the flip-flop 524A, relative to the clock period of the input clock signal 322. In a similar manner, the DOWN pulse results from the clock edge of the input clock signal 322 being provided to the phase detector 314B after the corresponding clock edge of the feedback signal 321. Thus, flip-flop 524B outputs a logical "1" before flip-flop 524A outputs a logical "1". The length of the DOWN pulse is limited by the pulse limitation of the delay 512B. The minimum and maximum pulse width of the DOWN pulse may be predetermined by the length of time of the delay provided by delay element 512B and by the reset time of the flip-flop 524B, relative to the clock period of the input clock signal 322.

It is noted that in a preferred implementation of phase detector 314B, at least a minimum UP pulse and a minimum DOWN pulse are generated for each rising edge of the input clock signal 322. It is also noted that the supplemental correction pulse generator 535 may also be located in series with the DOWN pulse or in series with both the UP pulse and the DOWN pulse. For example, in an embodiment with the supplemental correction pulse generator 535 in series with the DOWN pulse, a runaway input clock signal 322 is determined to have failed. The supplemental correction pulse generator 535 is notified of the failure and generates a maximum pulse width DOWN pulse.

FIGS. 6A and 6B—Timing Diagrams

An example of the method of operation of the PLL 300 is illustrated in the timing diagrams of FIGS. 6A and 6B. It is contemplated that a variety of embodiments of PLL circuits may be designed to operate using the method disclosed herein. Broadly speaking, FIG. 6A illustrates the PLL 300 speeding up to match the input clock signal, while FIG. 6B 6A illustrates the PLL 300 slowing down to match the input clock signal.

The input clock signal 322, used as a timing reference, and feedback signal 321 are compared to detect a phase difference. The phase difference is output as a pair of digital pulses UP 315A and DOWN 315B that are indicative of the phase difference. The phase difference signals UP 315A and DOWN 315B are converted into an error correction signal used to produce oscillations. The feedback signal 321 is indicative of the oscillations. In time period 620, the rising edge of the input clock signal 322 is detected ahead of the corresponding rising edge of the feedback signal 321. A relatively wide UP pulse 315A and a minimum DOWN pulse 315B are generated in response to the phase difference between the input clock signal 322 and the feedback signal 321.

The relatively wide UP pulse 315A of time period 620 shortens the period of the feedback signal 321 such that the next rising edge of the feedback signal 321 is detected during time period 621 a shorter time after the corresponding rising edge of the input clock signal 322. In time period 621, a narrower UP pulse 315A (relative to the UP pulse 315A of time period 620) and a minimum DOWN pulse 315B are generated in response to the phase difference between the input clock signal 322 and the feedback signal 321. The narrower UP pulse 315A is wider than the minimum DOWN pulse 315B.

The narrower UP pulse 315A of time period 621 shortens the period of the feedback signal 321 such that the next rising edge of the feedback signal 321 is detected during time period 622 only a short period of time after the corresponding rising edge of the input clock signal 322. In time period 622, an even narrower UP pulse 315A (relative to the UP pulse 315A of time period 621) and a minimum DOWN pulse 315B are generated in response to the phase difference between the input clock signal 322 and the feedback signal 321. The even narrower UP pulse 315A is only slightly wider than the minimum DOWN pulse 315B.

The effect of the even narrower UP pulse 315A of time period 622 just shortens the period of the feedback signal 321 such that the next rising edge of the feedback signal 321 is detected during time period 623 substantially concurrently with the corresponding rising edge of the input clock signal 322. In time period 623, a minimum UP pulse 315A and a minimum DOWN pulse 315B are generated in response to the phase difference between the input clock signal 322 and the feedback signal 321. The minimum UP pulse 315A is substantially the same width as the minimum DOWN pulse 315B in a preferred embodiment. Other pulse width minimums are, however, contemplated.

In FIG. 6B, the input clock signal 322 is again used as a timing reference and is compared to feedback signal 321 to detect a phase difference. The phase difference is output as a pair of digital pulses UP 315A and DOWN 315B that are indicative of the phase difference. The phase difference signals UP 315A and DOWN 315B are converted into an error correction signal used to produce oscillations. The feedback signal 321 is indicative of the oscillations. In time period 670, the rising edge of the input clock signal 322 is detected a substantial period of time after the corresponding rising edge of the feedback signal 321. A relatively wide DOWN pulse 315B and a minimum UP pulse 315A are generated in response to the phase difference between the input clock signal 322 and the feedback signal 321.

The relatively wide DOWN pulse 315B of time period 670 lengthens the period of the feedback signal 321 such that the next rising edge of the feedback signal 321 is detected during time period 671 only a short time before the corresponding rising edge of the input clock signal 322. In time period 671, a relatively narrow DOWN pulse 315B (relative to the DOWN pulse 315B of time period 670) and a minimum UP pulse 315A are generated in response to the phase difference between the input clock signal 322 and the feedback signal 321. The relatively narrow DOWN pulse 315B is wider than the minimum UP pulse 315A.

The relatively narrow DOWN pulse 315B of time period 671 shortens the period of the feedback signal 321 such that the next rising edge of the feedback signal 321 is detected during time period 672 slightly after the corresponding rising edge of the input clock signal 322. In time period 672, a relatively narrow UP pulse 315A and a minimum DOWN pulse 315B are generated in response to the phase difference between the input clock signal 322 and the feedback signal 321. The relatively narrow UP pulse 315A is only slightly wider than the minimum DOWN pulse 315B.

The effect of the relatively narrow UP pulse 315A of time period 672 just shortens the period of the feedback signal 321 such that the next rising edge of the feedback signal 321 is detected during time period 672 substantially concurrently with the corresponding rising edge of the input clock signal 322. In time period 672, a minimum UP pulse 315A and a minimum DOWN pulse 315B are generated in response to the phase difference between the input clock signal 322 and the feedback signal 321. The minimum UP pulse 315A is substantially the same width as the minimum DOWN pulse 315B in a preferred embodiment. Other pulse width minimums are, however, contemplated.

Figure 7:
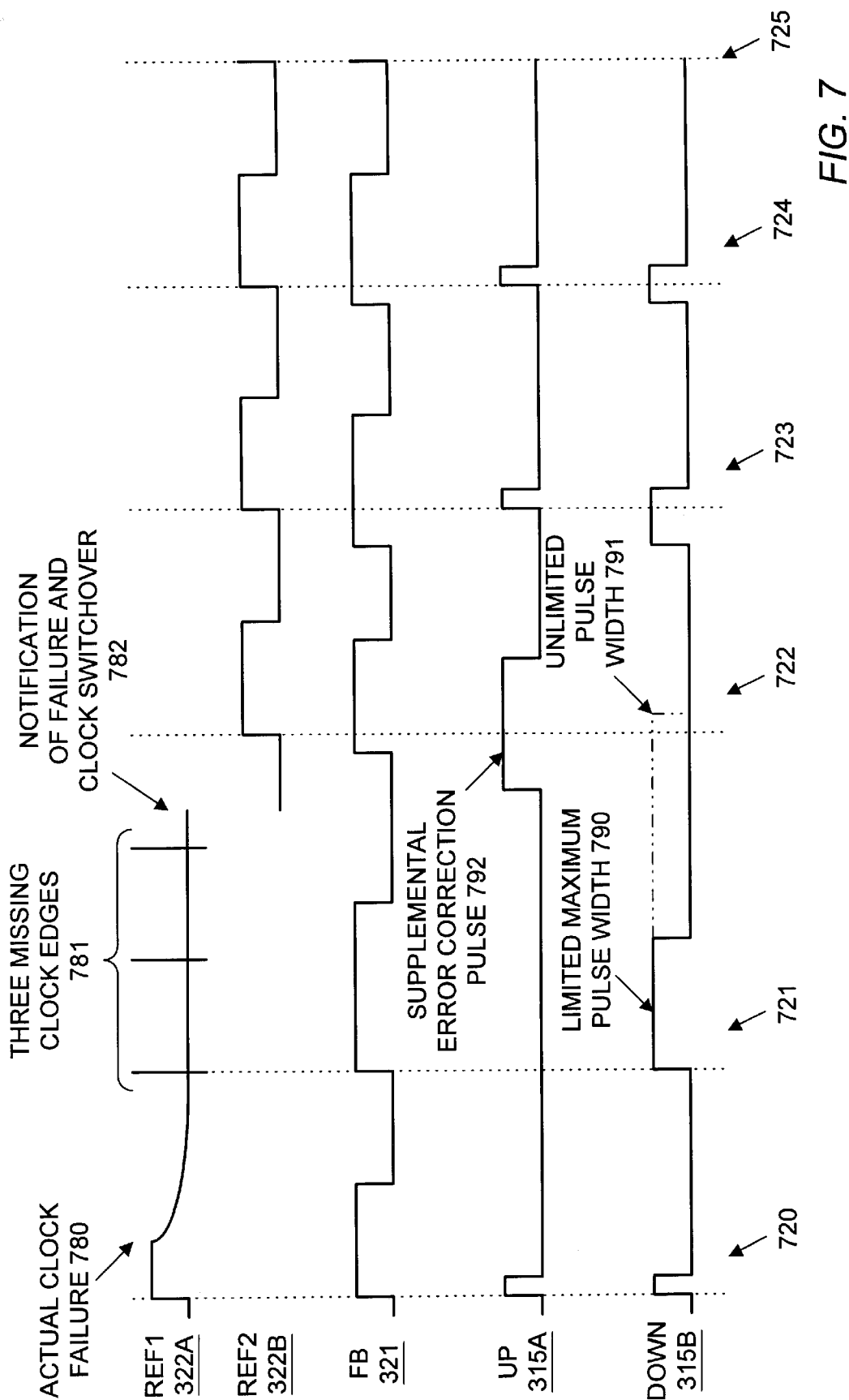
FIG. 7 is a timing diagram of advanced operation of the PLL of FIG. 3, including switchover to a backup clock source, limited width phase error signal pulses, and a supplemental error correction pulse.

FIG. 7—Timing Diagram with Clock Switchover

In FIG. 7, a timing diagram of several advanced operations of the PLL of FIG. 3, including switchover to a backup clock source, limited width phase error signal pulses, and a supplemental error correction pulse are illustrated. The first reference clock signal REF1 is shown as input clock signal 322A from a first clock source. The second reference clock signal REF2 is shown as input clock signal 322B from a second clock source. The feedback signal 321 and the input clock signal 322 are compared, as in FIGS. 6A and 6B, to produce a phase error signal. An UP pulse 315A and a DOWN pulse 315B are shown as comprising the phase error signal.

In time period 720, the first input clock signal 322A and the feedback signal 321 are in phase. A minimum width UP pulse 315A and a minimum width DOWN pulse 315B are shown. Note that the first input clock signal 322A fails 780 during time period 780. The first input clock signal 322A is monitored for a failure. However, as shown, the failure may not be recognized until time period 721, when three clock edges are missed 781.

During clock period 721, with no input clock signal 322A being provided, the feedback signal 321 shows a longer period in response to the lack of an UP pulse 315A and the extremely width DOWN pulse 315B. Note that the pulse width of the DOWN pulse 315B is limited to a predetermined maximum width 790. The unlimited pulse width is shown as 791. In addition, during clock period 721, the input clock source failure is recognized and the input clock is switched over to a second input clock source 322B in response. In addition, in response to the input clock failure, the supplemental error correction pulse 792 is injected as a maximum length UP pulse.

During clock period 722, the backup input clock signal 322B is now the reference clock signal. The supplemental error correction pulse 792 results in the feedback signal 321 having a shorter period than in clock period 721, closer to the correct phase alignment with the reference clock signal that would occur without the supplemental error correction pulse 792. Note that the missing UP pulse 315A from clock period 721 may occur in clock period 722. It is not seen in clock period 722 due to the supplemental error correction pulse 792. In one embodiment, the supplemental error correction pulse 792 is in addition to the UP pulse 315A. In another embodiment, the supplemental error correction pulse 792 replaces the UP pulse 315A.

During clock periods 723 and 724, the PLL circuit aligns the reference clock signal 322B and the feedback signal 321 in a manner similar to that shown in FIGS. 6A and 6B. Note that in clock period 725, the input clock signal 322B and the feedback signal 321 are in phase. It is noted that a failure of a clock source may be defined as the loss of as few as one clock edge, either rising or falling.

Numerous variations and modifications will become apparent to those skilled in the art once the above disclosure is fully appreciated. It is intended that the following claims be interpreted to embrace all such variations and modifications.

What is claimed is:

1. A phase-locked loop (PLL), comprising:
   a phase detector coupled to receive an input clock signal from a first one of a plurality of clock sources and a feedback signal, wherein said phase detector outputs a phase error signal indicative of a comparison between said input clock signal and said feedback signal;
   a loop filter coupled to receive said phase error signal and to output an error correction signal;
   a voltage controlled oscillator coupled to receive said error correction signal and to generate an output signal of the PLL, wherein said feedback signal is indicative of said output signal of the PLL; and
   switching logic coupled to monitor said input clock signal from said first one of said plurality of clock sources for a failure, wherein said switching logic is configured to cause a corresponding input clock signal from a second one of said plurality of clock sources to be provided to said phase detector in response to said failure;
   wherein a supplemental correction signal is provided to said loop filter in response to said failure; and
   wherein in response to said failure, said supplemental correction signal is provided to said loop filter in addition to said phase error signal.

2. The PLL of claim 1, wherein said switching logic provides said input clock signal from said second one of said plurality of clock sources in place of said input clock signal from said first one of said plurality of clock sources.

3. The PLL of claim 1, wherein said phase error signal comprises at least one digital signal.

4. The PLL of claim 3, wherein said phase error signal includes a plurality of digital signals, wherein said plurality of digital signals includes an UP pulse and a DOWN pulse, wherein said UP pulse is indicative of a phase difference between said feedback signal and said input clock when an edge of said feedback signal occurs after a corresponding edge of said input clock occurs, and wherein said DOWN pulse is indicative of a phase difference between said feedback signal and said input clock when an edge of said feedback signal occurs before a corresponding edge of said input clock occurs.

5. The PLL of claim 4, further comprising:
   a pulse limiting circuit which shortens a pulse width of said UP pulse and said DOWN pulse.

6. The PLL of claim 4, wherein said failure includes an absence of one or more clock edges of said input clock signal.

7. The PLL of claim 6, wherein said failure results in a maximum length DOWN pulse.

8. The PLL of claim 7, wherein said supplemental correction signal comprises a maximum length UP pulse.

9. The PLL of claim 1, further comprising:
   a first multiplexer coupled to receive said input clock signal from two or more of said plurality of clock sources and to output a selected input clock signal from said two or more of said plurality of clock sources in response to a clock selection signal.

10. The PLL of claim 9, wherein said clock selection signal is an external input to said PLL.

11. The PLL of claim 9, wherein said clock selection signal is generated by said switching logic in response to said failure.

12. The PLL of claim 1, wherein said loop filter comprises an active filter.

13. The PLL of claim 12, wherein said active filter is configured as an integrator.

14. The PLL of claim 13, wherein said active filter is further configured as a low-pass filter.

15. The PLL of claim 1, wherein said PLL is comprised on a monolithic integrated circuit.

16. The PLL of claim 1, wherein said failure includes an absence of one or more clock edges of said input clock signal.

17. The PLL of claim 1, wherein said phase detector is further configured to output said supplemental correction signal.

18. A method for operating a phase-locked loop circuit, the method comprising:
   detecting a phase difference between an input clock signal from a first one of a plurality of clock sources and a feedback signal;
   outputting a phase error signal indicative of said phase difference;
   converting said phase error signal into an error correction signal;
   producing oscillations in response to said error correction signal, wherein said feedback signal is indicative of said oscillations;
   monitoring said input clock signal from said first one of said plurality of clock sources for a failure;
   providing a corresponding input clock signal from a second one of said plurality of clock sources in place of said input clock signal from said first one of said plurality of clock sources in response to said failure; and
   outputting a supplemental correction signal in response to said failure, wherein in response to said failure, said supplemental correction signal is output in addition to said phase error signal.

19. The method of claim 18, wherein said phase error signal comprises at least one digital signal.

20. The method of claim 19, wherein said outputting a phase error signal indicative of said phase difference comprises outputting a plurality of digital phase error signals indicative of said phase difference, wherein said plurality of digital signals includes an UP pulse and a DOWN pulse, wherein said UP pulse is indicative of a phase difference between said feedback signal and said input clock when an edge of said feedback signal occurs after a corresponding edge of said input clock occurs, and wherein said DOWN pulse is indicative of a phase difference between said feedback signal and said input clock when an edge of said feedback signal occurs before a corresponding edge of said input clock occurs.

21. The method of claim 20, further comprising:
limiting a maximum pulse width of said UP pulse and said DOWN pulse to a predetermined pulse width.

22. The method of claim 20, wherein said failure includes an absence of one or more clock edges of said input clock signal.

23. The method of claim 22, wherein said failure results in a maximum length DOWN pulse.

24. The method of claim 23, wherein said supplemental correction signal comprises a maximum length UP pulse.

25. A phase-locked loop (PLL) circuit, comprising:
means for detecting a phase difference between an input clock signal from a first one of a plurality of clock sources and a feedback signal, wherein said means for detecting is configured to output a phase error signal indicative of said phase difference;
means for converting said phase error signal into an error correction signal;
means for producing oscillations in response to said error correction signal, wherein said feedback signal is indicative of said oscillations;
means for monitoring said input clock signal from said first one of said plurality of clock sources for a failure;
means for providing a corresponding input clock signal from a second one of said plurality of clock sources to said means for detecting in response to said means for monitoring determining said failure; and
means for outputting a supplemental correction signal to said means for converting in response to said failure; and wherein in response to said failure, said supplemental correction signal is output in addition to said phase error signal.

26. The PLL circuit of claim 25, wherein said phase error signal comprises at least one digital signal.

27. The PLL circuit of claim 26, wherein said phase error signal comprises a plurality of digital signals, wherein said plurality of digital signals includes an UP pulse and a DOWN pulse, wherein said UP pulse is indicative of a phase difference between said feedback signal and said input clock when an edge of said feedback signal occurs after a corresponding edge of said input clock occurs, and wherein said DOWN pulse is indicative of a phase difference between said feedback signal and said input clock when an edge of said feedback signal occurs before a corresponding edge of said input clock occurs.

28. The PLL circuit of claim 27, further comprising:
means for limiting a maximum pulse width of said UP pulse and said DOWN pulse to a predetermined pulse width.

29. The PLL circuit of claim 27, wherein said failure includes an absence of one or more clock edges of said input clock signal.

30. The PLL circuit of claim 29, wherein said failure results in a maximum length DOWN pulse.

31. The PLL circuit of claim 30, wherein said supplemental correction signal comprises a maximum length UP pulse.

* * * * *